United States Patent
Fan et al.

(10) Patent No.: US 9,240,396 B2
(45) Date of Patent: Jan. 19, 2016

(54) PIXEL STRUCTURE OF LIGHT EMITTING DIODE

(71) Applicant: AU Optronics Corp., Hsin-Chu (TW)

(72) Inventors: Chun-Pin Fan, Hsin-Chu (TW);
Yu-Sheng Huang, Hsin-Chu (TW);
Ying-Ying Chen, Hsin-Chu (TW);
Ting-Wei Guo, Hsin-Chu (TW);
Kuo-Hsiang Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/277,791

(22) Filed: May 15, 2014

(65) Prior Publication Data
US 2015/0084054 A1    Mar. 26, 2015

(30) Foreign Application Priority Data
Sep. 25, 2013   (TW) .............................. 102134620 A

(51) Int. Cl.
| | |
|---|---|
| *H01L 27/12* | (2006.01) |
| *H01L 25/075* | (2006.01) |
| *G02F 1/00* | (2006.01) |
| *H01L 33/62* | (2010.01) |

(52) U.S. Cl.
CPC .............. *H01L 25/0753* (2013.01); *G02F 1/00* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 5,206,749 A | 4/1993 | Zavracky | |
| 6,111,627 A | 8/2000 | Kim | |
| 2004/0252089 A1* | 12/2004 | Ono et al. | ........................ 345/82 |
| 2005/0078261 A1 | 4/2005 | Ono | |
| 2007/0216613 A1* | 9/2007 | Ogura et al. | ..................... 345/76 |
| 2008/0035920 A1 | 2/2008 | Takechi | |
| 2010/0002179 A1 | 1/2010 | Horiguchi | |
| 2011/0050550 A1* | 3/2011 | Tsai et al. | ......................... 345/76 |
| 2012/0119237 A1 | 5/2012 | Leatherdale | |
| 2012/0175607 A1 | 7/2012 | Shu | |
| 2013/0126890 A1* | 5/2013 | Bedell et al. | ..................... 257/76 |

FOREIGN PATENT DOCUMENTS

TW    201117353    5/2011

* cited by examiner

*Primary Examiner* — Khaja Ahmad
(74) *Attorney, Agent, or Firm* — Winston Hsu; Scott Margo

(57) ABSTRACT

This disclosure provides a pixel structure of inorganic light emitting diode. A first power line is disposed between two adjacent first sub-pixel and second sub-pixel, and the first sub-pixel and second sub-pixel are electrically connected to the same first power line. Also, a first reference line is disposed on an opposite side of the first sub-pixel away from the second sub-pixel, and a second reference line is disposed on an opposite side of the second sub-pixel away from the first sub-pixel. The first sub-pixel and the second sub-pixel have substantially the same length.

34 Claims, 7 Drawing Sheets

PIXEL STRUCTURE OF LIGHT EMITTING DIODE

BACKGROUND OF THE DISCLOSURE

1. Field of the Disclosure

The disclosure relates to a pixel structure of inorganic light emitting diode, and more particularly, to a pixel structure of inorganic light emitting diode including uniformly spaced sub pixels.

2. Description of the Background

In recent years, with the progress of semiconductor and related technologies, electronic products, such as personal digital assistants (PDA), mobile phones, smart phones and notebook (NB) are getting popular, and the trend of design is focused on providing these electronic products with facilitation, multi-functions and aesthetic. As the demands for those electronic products are increased daily, the display screen/panel, which plays an important role in those electronic products, has become the primary objective to designers in this field. However, in addition to achieve high brightness and low power consumption, it is more desirable to significantly overcome the disadvantages of the display screen/panel, including low uniformity of light, yield and reliability.

SUMMARY OF THE DISCLOSURE

It is one of the objectives of this disclosure to provide a pixel structure of inorganic light emitting diode, so as to improve the uniformity of light.

An embodiment of this disclosure provides a pixel structure of inorganic light emitting diode, including a plurality of sub-pixels defined on an insulation substrate, a first transistor unit, a second transistor unit, at least one first reference line, at least one second reference line, at least one data line, at least one scan line, a first pixel electrode, a second pixel electrode, at least two first inorganic light emitting diodes, at least two second inorganic light emitting diodes, at least one first power line, and at least one second power line. The sub-pixels are defined on an insulation substrate and arranged in an identical row or an identical column, and the sub-pixels at least include a first sub-pixel and a second sub-pixel adjacent to the first sub-pixel. The first sub-pixel at least comprises a first boundary, a second boundary and a third boundary connected to the first boundary and the second boundary, the second sub-pixel at least includes a fourth boundary, a fifth boundary and a sixth boundary connected to the fourth boundary and the fifth boundary, and a common boundary is disposed at a border between the first sub-pixel and the second sub-pixel and connected to the first boundary, the second boundary, the fourth boundary and the fifth boundary. The first transistor unit is disposed in the first sub-pixel and at least includes a first switch element, a second switch element and a first driving element. The second transistor unit is disposed in the second sub-pixel and at least includes a third switch element, a fourth switch element and a second driving element. The first reference line is disposed on the insulation substrate and adjacent to the third boundary of the first sub-pixel, wherein the first reference line is electrically connected to a first end of the second switch element. The second reference line is disposed on the insulation substrate and adjacent to the sixth boundary of the second sub-pixel, wherein, the second reference line is electrically connected to a first end of the fourth switch element. The data line is disposed on the insulation substrate and electrically connected to a first end of the first switch element and a first end of the third switch element. The scan line is disposed on the insulation substrate and electrically connected to a control end of the first switch element and a control end of the third switch element. The first pixel electrode is disposed in the first sub-pixel and electrically connected to a first end of the first driving element. The second pixel electrode is disposed in the second sub-pixel and electrically connected to a first end of the second driving element. The first inorganic light emitting diodes are disposed on the first pixel electrode of the first sub-pixel, and each of the first inorganic light emitting diodes at least includes a first electrode, a second electrode and a first inorganic light emitting layer interposed between the first electrode and the second electrode. The second inorganic light emitting diodes are disposed on the second pixel electrode of the second sub-pixel, and each of the second inorganic light emitting diodes at least includes a third electrode, a fourth electrode and a second inorganic light emitting layer interposed between the third electrode and the fourth electrode. The first power line is disposed on the insulation substrate and adjacent to the common boundary, wherein the first power line is electrically connected to the second electrode of each of the first inorganic light emitting diodes and the fourth electrode of each of the second inorganic light emitting diodes. The second power line is disposed on the insulation substrate and electrically connected to a second end of the first driving element and a second end of the second driving element.

In the pixel structure of inorganic light emitting diode of this disclosure, the first power line is disposed between the first sub-pixel and the second sub-pixel adjacent to each other, and the first sub-pixel and the second sub-pixel share an OVSS signal provided by the same first power line. Furthermore, the first reference line is disposed adjacent to the third boundary of the first sub-pixel and the first reference line provides a first reference potential signal to the first sub-pixel, and the second reference line is disposed adjacent to the sixth boundary of the second sub-pixel and the second reference line provides a second reference potential signal to the second sub-pixel. With such arrangement, a first gap defined between the first power line and the first reference line can be substantially equal to a second gap defined between the first power line and the second reference line. Therefore, the first sub-pixel and the second sub-pixel have substantially the same length, so as to sufficiently improve the uniformity of light.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
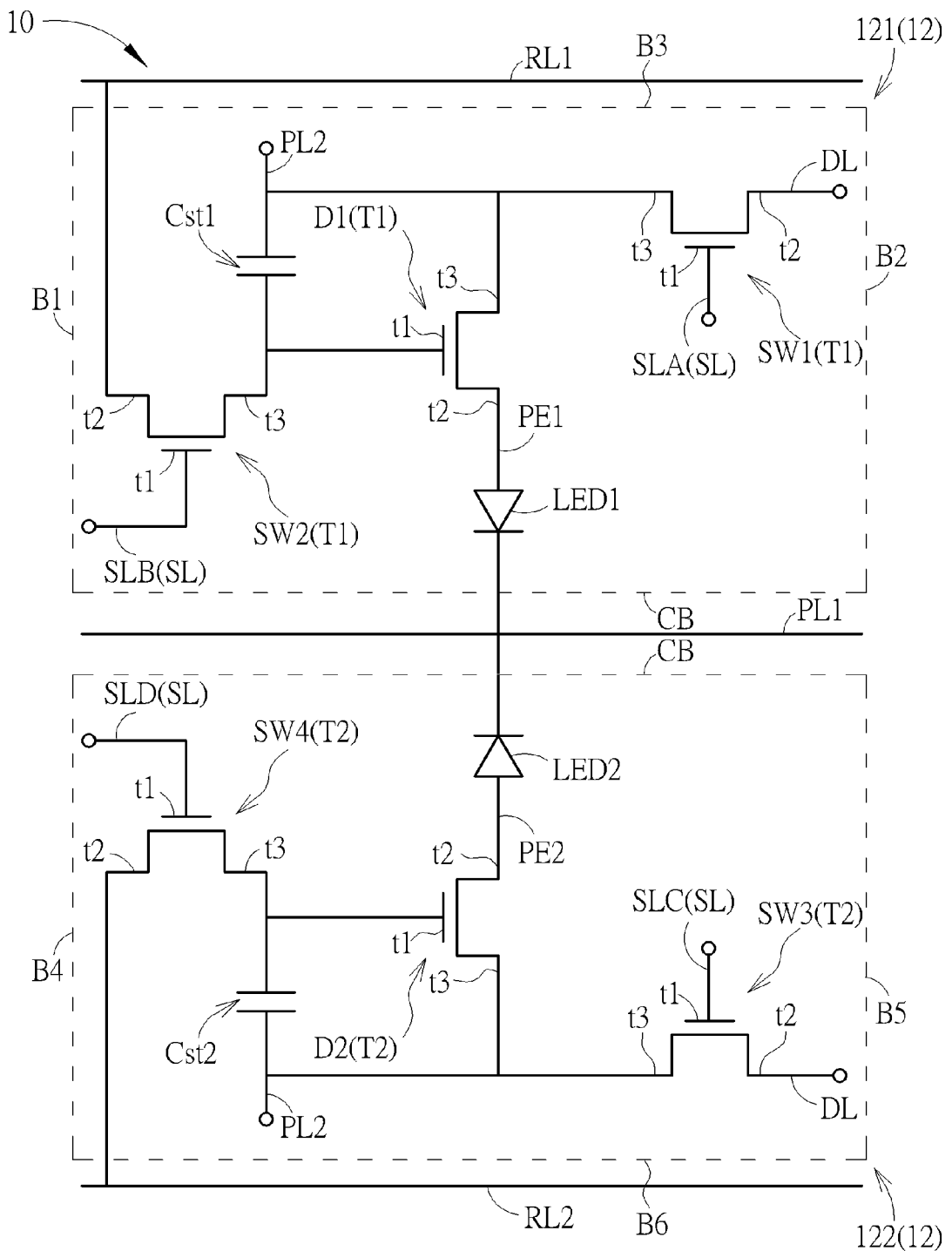
FIG. 1 is an equivalent circuit diagram of a pixel structure of inorganic light emitting diode according to a first embodiment.
Figure 2:
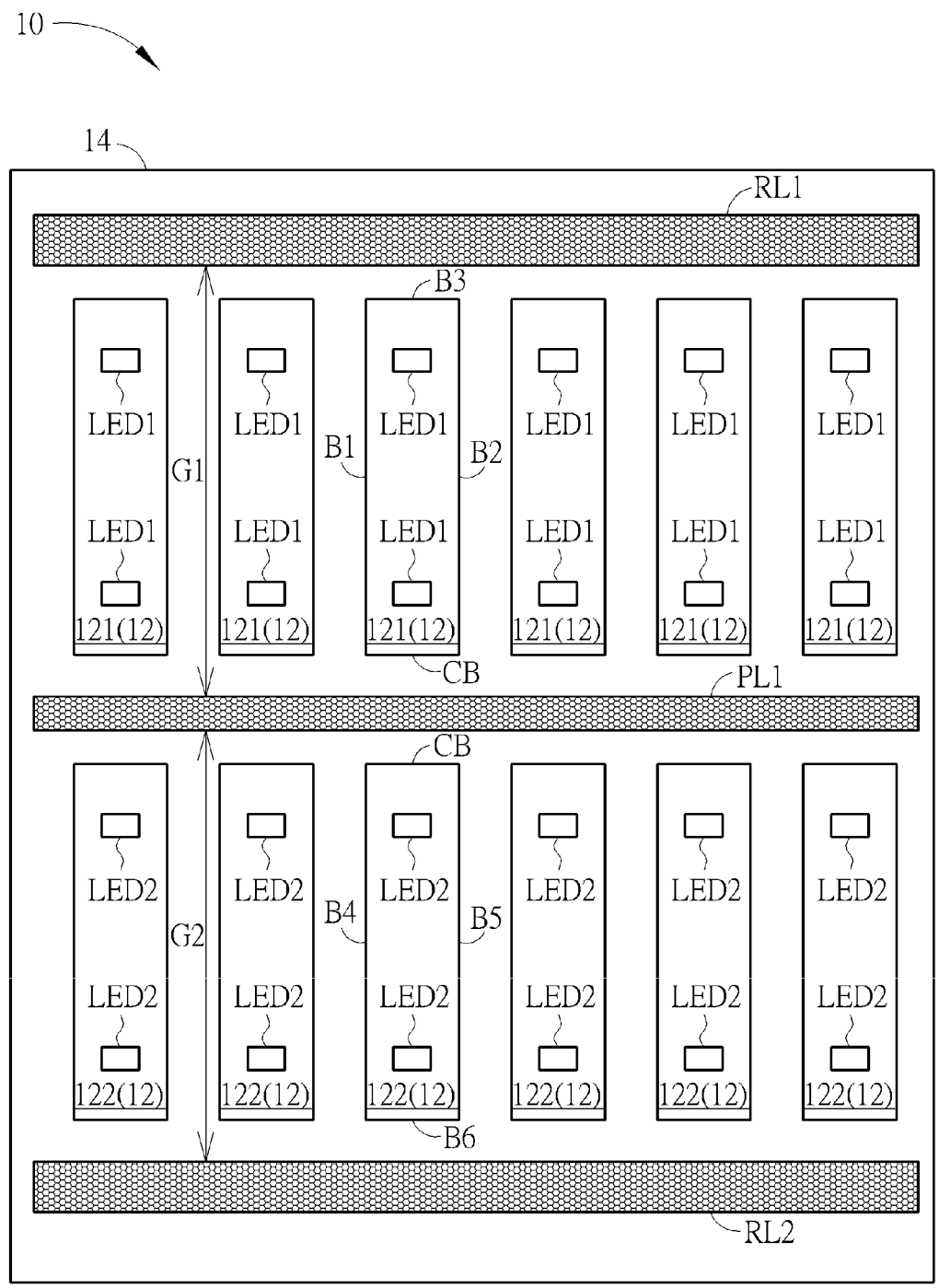
FIG. 2 is a top view diagram illustrating the pixel structure of inorganic light emitting diode according to the first embodiment.
Figure 3:
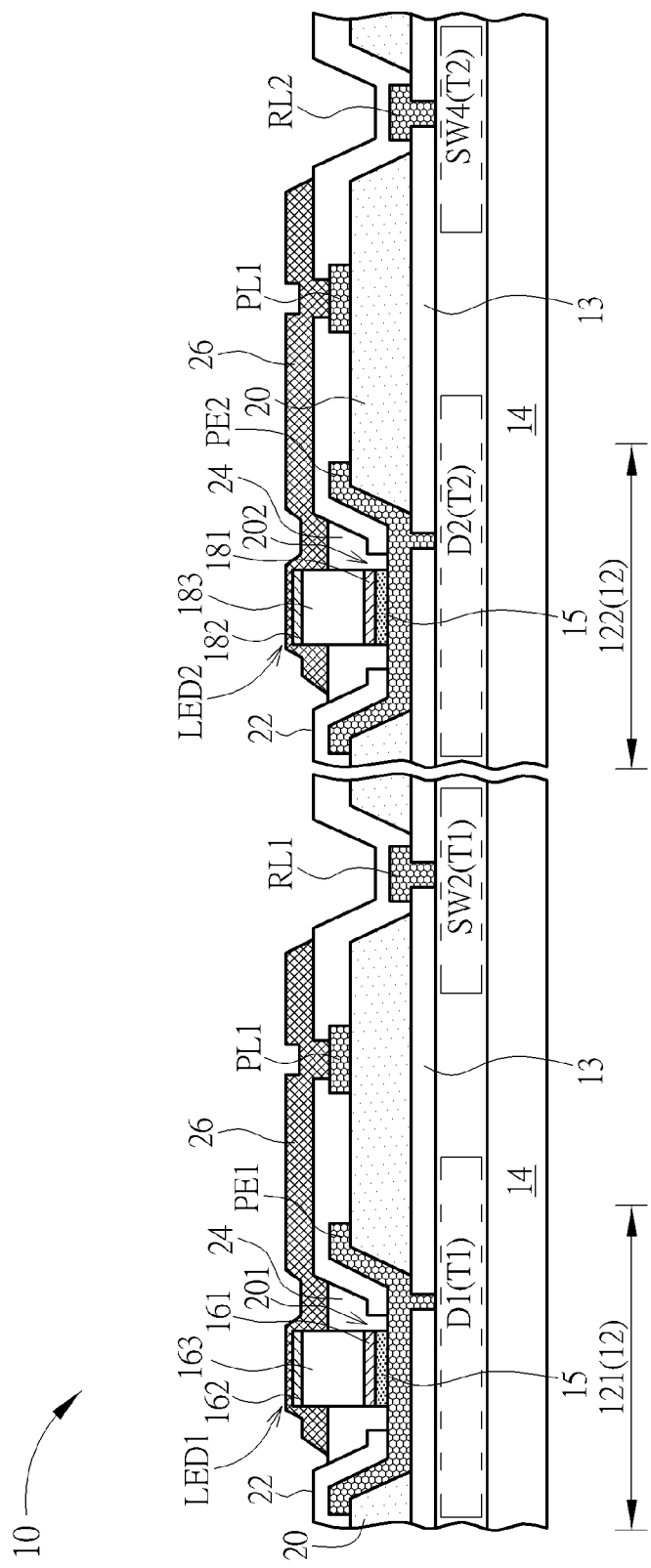
FIG. 3 is a cross-sectional diagram illustrating the pixel structure of inorganic light emitting diode according to the first embodiment.

Referring to FIGS. 1-3, FIG. 1 is an equivalent circuit diagram of a pixel structure of inorganic light emitting diode according to a first embodiment, FIG. 2 is a top view diagram illustrating the pixel structure of inorganic light emitting diode of the first embodiment and FIG. 3 is a cross-sectional diagram illustrating the pixel structure of inorganic light emitting diode of the first embodiment. As shown in FIGS. 1-3, the pixel structure 10 of inorganic light emitting diode according to this embodiment includes a plurality of sub-pixels 12, a first transistor unit (or namely first transistor group) T1, a second transistor unit (or namely second transistor group) T2, at least one first reference line RL1, at least one second reference line RL2, at least one date line DL, at least one scan line SL, a first pixel electrode PE1, a second pixel electrode PE2, at least two first inorganic light emitting diodes LED1, at least two second inorganic light emitting diodes LED2, at least one first power line PL1 and at least one second power line PL2. The sub-pixels 12 are formed and defined on an insulation substrate 14, and the sub-pixels 12 are arranged in an identical row/column (or namely in a same row/column). In other words, the sub-pixels 12 are arranged in an array arrangement (or namely in a matrix arrangement). The sub-pixels 12 at least include a first sub-pixel 121 and a second sub-pixel 122 adjacent to the first sub-pixel 121. In this embodiment, the first sub-pixel 121 and the second sub-pixel 122 are two adjacent sub-pixels 12 arranged in the same column (in a vertical direction of FIG. 2), but not limited thereto. In one variant embodiment, the first sub-pixel 121 and the second sub-pixel 122 can be two adjacent sub-pixels 12 arranged in the same row (in a horizontal direction of FIG. 2). The first sub-pixel 121 at least includes a first boundary B1, a second boundary B2 and a third boundary B3 connected to the first boundary B1 and the second boundary B2, the second sub-pixel 122 at least includes a fourth boundary B4, a fifth boundary B5 and a sixth boundary BE connected to the fourth boundary B4 and the fifth boundary B5, and there is a common boundary (or namely a share boundary) CB disposed at a border between the first sub-pixel 121 and the second sub-pixel 122 and connected to the first boundary B1, the second boundary B2, the fourth boundary B4 and the fifth boundary B5. Precisely speaking, the common boundary CB of the first sub-pixel 121 is connected to the first boundary B1 and the second boundary B2, the common boundary CB of the second sub-pixel 122 is connected to the fourth boundary B4 and the fifth boundary B5, and the common boundary CB of the first sub-pixel 121 contacts or overlaps the common boundary CB of the second sub-pixel 122. In one embodiment, the third boundary B3 is corresponding to the common boundary CB and the sixth boundary BE is corresponding to the common boundary CB, but not limited thereto.

The first transistor unit T1 is disposed in the first sub-pixel 121 and the first transistor unit T1 at least includes a first switch element SW1, a second switch element SW2, a first driving element D1 and a first storage capacitor Cst1. The second transistor unit T2 is disposed in the second sub-pixel 122 and the second transistor unit T2 at least includes a third switch element SW3, a fourth switch element SW4, a second driving element D2 and a second storage capacitor Cst2. In this disclosure, both of the "switch element" and the "driving element" may include a three-terminal element which includes a control end t1, a first end t2 and a second end t3. For example, the switch element and the driving element can be a thin film transistor (TFT) element respectively, wherein a gate electrode of the thin film transistor element is the control end t1, and a source electrode and a drain electrode are the first end t2 and the second end t3, respectively.

The first reference line RL1 is disposed on the insulation substrate 14 and adjacent to (or namely near to) the third boundary B3 of the first sub-pixel 121, and the first reference line RL1 is adapted to transmit a first reference potential signal to the first transistor unit T1; the second reference line RL2 is disposed on the insulation substrate 14 and adjacent to (or namely near to) the sixth boundary BE of the second sub-pixel 122, and the second reference line RL2 is adapted to transmit a second reference potential signal to the second transistor unit T2, wherein the first reference potential signal and the second reference potential signal can be substantially identical or different from each other. In this embodiment, the first reference potential signal and the second reference potential signal are substantially identical in a best mode, but not limited thereto. In some preferred embodiment, the first reference line RL1 is located at the third boundary B3 of the first sub-pixel 121 and/or the second reference line RL2 is located at the sixth boundary BE of the second sub-pixel 122. The first pixel electrode PE1 is disposed in the first sub-pixel 121 and the second pixel electrode PE2 is disposed in the second sub-pixel 122. The first power line PL1 is disposed on the insulation substrate 14 and adjacent to (or namely near to) the common boundary CB (i.e. the first power line PL1 is between the first sub-pixel 121 and the second sub-pixel 122). In some preferred embodiment, the first power line PL1 is located at the common boundary CB. In this embodiment, an electric potential of the first power line PL1 is different from an electric potential of the second power line PL2. For example, the first power line PL1 is used to transmit an OVSS signal and the second power line PL2 is used to transmit an OVDD signal. Thus, as driving the inorganic light emitting diodes corresponding to each sub-pixel 12 respectively, the signal or the electric potential of the second power line PL2, preferred, is substantially greater than the signal or the electric potential of the first power line PL1, so that the signal or the electric potential of the second power line PL2 is sufficient (or namely enable) to drive the inorganic light emitting diodes corresponded to each sub-pixel 12 respectively. Furthermore, as driving the inorganic light emitting diodes corresponding to each sub-pixel 12 respectively, the signal or the electric potential of the second power line PL2, preferred, is substantially greater than the signals and the electric potentials of the first reference line RL1 and the second reference line RL2, so that the signal or the electric potential of the second power line PL2 is sufficient to drive the inorganic light emitting diodes corresponded to each sub-pixel 12 respectively. Optionally, the signal of the first power line PL1 can be substantially the same as or different from the signal of the first reference line RL1 and/or the signal of the second reference line RL2. Also, in this embodiment, there is a first gap G1 formed between the first power line PL1 and the first reference line RL1 projected on the insulation substrate 14 and a second gap G2 formed between the first power line PL1 and the second reference line RL2 projected on the insulation substrate 14, and the first gap G1 is substantially equal to the second gap G2. Accordingly, the first sub-pixel 121 and the second sub-pixel 122 have substantially the same length. In this embodiment, the first pixel electrode PE1, the second pixel electrode PE2, a first reference line RL1, a second reference line RL2 and the first power line PL1 are isolated from one another. In one embodiment, the first pixel electrode PE1, the second pixel electrode PE2, the first reference line RL1, the second reference line RL2 and the first power line PL1 can be made of the same patterned conductive layer, but not limited thereto.

The control end t1 of the first switch element SW1 is electrically connected to the scan line SLA, the first end t2 of the first switch element SW1 is electrically connected to the data line DL and the second end t3 of the first switch element SW1 is electrically connected to the second power line PL2 and the second end t3 of the first driving element D1. The control end t1 of the second switch element SW2 is electrically connected to another scan line SLB, the first end t2 of the second switch element SW2 is electrically connected to the first reference line RL1 and the second end t3 of the second switch element SW2 is electrically connected to the control end t1 of the first driving element D1 and the second power line PL2. The control end t1 of the first driving element D1 is electrically connected to the second end t3 of the second switch element SW2, the first end t2 of the first driving element D1 is electrically connected to the first pixel electrode PE1, and the second end t3 of the first driving element D1 is electrically connected to the second end t3 of the first switch element SW1 and the second power line PL2. The first storage capacitor Cst1 is electrically connected between the second power line PL2 and the second end t3 of the second switch element SW2. For example, first end of the first storage capacitor Cst1 is connected to the second power line PL2, the second end t3 of the first driving element D1 and the second end t3 of the first switch element SW1, and second end of the first storage capacitor Cst1 is connected to the second end t3 of the second switch element SW2 and the control end t1 of the first driving element D1. In other words, the second power line PL2 is electrically connected to the second end t3 of the second switch element SW2 through the first storage capacitor Cst1. The control end t1 of the third switch element SW3 is electrically connected to the scan line SLC, the first end t2 of the third switch element SW3 is electrically connected to the data line DL and the second end t3 of the third switch element SW3 is electrically connected to the second power line PL2 and the second end t3 of the second driving element D2. The control end t1 of the fourth switch element SW4 is electrically connected to another scan line SLD, the first end t2 of the fourth switch element SW4 is electrically connected to the second reference line RL2 and the second end t3 of the fourth switch element SW4 is electrically connected to the control end t1 of the second driving element D2 and the second power line PL2. The control end t1 of the second driving element D2 is electrically connected to the second end t3 of the fourth switch element SW4, the first end t2 of the second driving element D2 is electrically connected to the second pixel electrode PE2 and the second end t3 of the second driving element D2 is electrically connected to the second end t3 of the third switch element SW3 and the second power line PL2. The second storage capacitor Cst2 is electrically connected between the second power line PL2 and the second end t3 of the fourth switch element SW4. For example, first end of the second storage capacitor Cst2 is connected to the second power line PL2, the second end t3 of the second driving element D2 and the second end t3 of the third switch element SW3, and second end of the second storage capacitor Cst2 is connected to the second end t3 of the fourth switch element SW4 and the control end t1 of the second driving element D2. In other words, the second power line PL2 is electrically connected to the second end t3 of the fourth switch element SW4 through the second storage capacitor Cst2.

The first pixel electrode PE1 is electrically connected to the first end t2 of the first driving element D1, and the second pixel electrode PE2 is electrically connected to the first end t2 of the second driving element D2. The first power line PL1 is electrically connected to a second electrode 162 of each first inorganic light emitting diode LED1 and electrically connected to a fourth electrode 182 of each second inorganic light emitting diode LED2. The second power line PL2 is disposed on the insulation substrate 14 and electrically connected to the second end t3 of the first driving element D1 and the second end t3 of the second driving element D2. In this embodiment, the scan line SLA and the scan line SLB can be different scan lines and are adapted to transmit a scan signal respectively. Also, a timing of the scan signal of the scan line SLA is behind the timing of the scan signal of the scan line SLB, e.g. the scan line SLA can be the scan line SL of the sub-pixel 12 arranged in a prior column or row and the scan line SLB can be the scan line of the sub-pixel 12 arranged in a next column or row to the prior column or row. The scan line SLC and the scan line SLD can be different scan lines and are adapted to transmit a scan signal respectively. Also, a timing of the scan signal of the scan line SLC is behind a timing of the scan signal of the scan line SLD, e.g. the scan line SLC can be the scan line SL of the sub-pixel 12 arranged in a prior column or row and the scan line SLD can be the scan line SL of the sub-pixel 12 arranged in a next column or row to the prior column or row. Furthermore, the timing of the scan signal of the scan line SLD can be the same as the timing of the scan signal of the scan line SLA, but not limited thereto. In other embodiments, the scan signal of the scan line SLA can be substantially the same as the scan signal of the scan line SLC, or the scan signal of the scan line SLB can be substantially the same as the scan signal of the scan line SLD.

The first inorganic light emitting diodes LED1 are disposed on the first pixel electrode PE1 of the first sub-pixel 121, and each first inorganic light emitting diode LED1 at least includes a first electrode 161, a second electrode 162 and a first inorganic light emitting layer [or namely P-N (positive-negative) diode layer] 163 interposed between the first electrode 161 and the second electrode 162. The second inorganic light emitting diodes LED2 are disposed on the second pixel electrode PE2 of the second sub-pixel 122, and each second inorganic light emitting diode LED2 at least includes a third electrode 181, a fourth electrode 182 and a second inorganic light emitting layer [or namely P-N (positive-negative) diode layer] 183 interposed between the third electrode 181 and the fourth electrode 182. In this embodiment, the first inorganic light emitting diodes LED1 and the second inorganic light emitting diodes LED2 are selected from top emission type inorganic light emitting diodes. Thus, the first electrode 161 and the third electrode 181 may include a single-layered or a multi-layered structure, and a material of the first electrode 161 and the third electrode 181 includes a transparent material, such as indium tin oxide (ITO), indium zinc oxide (IZO), zinc oxide, a conductive material including nanosized metal or alloy particles, carbon nanotubes, graphene, a metal or alloy having a thickness less than about 10 nanometers (nm) or other suitable materials; or a reflective material, such as metal, alloy or other suitable materials. And the second electrode 162 and the fourth electrode 182 includes a single-layered or a multi-layered structure, and a material of the second electrode 162 and the fourth electrode 182 includes a transparent material, such as indium tin oxide (ITO), indium zinc oxide (IZO), zinc oxide, a conductive material including nanosized metal or alloy particles, carbon nanotubes, graphene, a metal or alloy having a thickness less than about 10 nanometers, or other suitable materials. A material of the first inorganic light emitting layer (or namely P-N diode layer) 163 and the second diode layer 183 may include a single-layered or multi-layered semiconductor material layer, wherein each semiconductor material layer can include Group II-VI materials, such as zinc selenide (ZnSe), Group III-V materials, such as gallium nitride (GaN), aluminum nitride (AlN), indium nitride (InN), or an alloy of the aforementioned materials. In this embodiment, in addition to the example of the first inorganic light emitting layer 163 and the second inorganic light emitting diode layer (or namely P-N diode layer) 183, the disclosure can also use a PIN (positive-intrinsic-negative) diode layer, a PI (positive-intrinsic) diode layer, an NI (negative-intrinsic) diode layer, other suitable diode layer or at least two aforementioned diode layers connected in series or in parallel. In addition, the number of the first inorganic light emitting diodes LED1 and the number of the second inorganic light emitting diodes LED2 are not limited to two, and the number of the first inorganic light emitting diodes LED1 and second inorganic light emitting diodes LED2 can be increased, such as three, four or more, according to the requirement of luminance or other considerations.

In this embodiment, the first inorganic light emitting diodes LED1 and the second inorganic light emitting diodes LED2 are fabricated at first, and then attached to the first pixel electrode PE1 and the second pixel electrode PE2 and electrically connected to the first pixel electrode PE1 and the second pixel electrode PE2 respectively, instead of each films in the light emitting diodes LED1 and LED2 being directly formed on the first pixel electrode PE1 and the second pixel electrode PE2 through a thin film process. For example, the first inorganic light emitting diodes LED1 and the second inorganic light emitting diodes LED2 can be clipped or carried by using a micromachined device, and then the first inorganic light emitting diodes LED1 and the second inorganic light emitting diodes LED2 are attached to the first pixel electrode PE1 and the second pixel electrode PE2 respectively by using a conductive adhesive layer 15 and the first inorganic light emitting diodes LED1 and the second inorganic light emitting diodes LED2 are electrically connected to the first pixel electrode PE1 and the second pixel electrode PE2 respectively. In other words, the conductive adhesive layer 15 is interposed between the first pixel electrode PE1 and the first electrode 161 of each first inorganic light emitting diode LED1, and also interposed between the second pixel electrode PE2 and the third electrode 181 of each second inorganic light emitting diode LED2. The conductive adhesive layer 15 has electrically conductive and meltable properties, so that the conductive adhesive layer 15 can be melted through a heating process. The attaching of the first inorganic light emitting diodes LED1 and the second inorganic light emitting diodes LED2 can be achieved through the following process. First of all, the conductive adhesive layer 15 is formed on a portion of the first pixel electrode PE1 and the second pixel electrode PE2 corresponding to each first inorganic light emitting diode LED1 and the second inorganic light emitting diode LED2 respectively, the conductive adhesive layer 15 is melted, and each first inorganic light emitting diode LED1 and each second inorganic light emitting diode LED2 are then disposed on and in contact with the conductive adhesive layer 15 on the corresponding portion of the first pixel electrode PE1 and the second pixel electrode PE2 respectively; or the conductive adhesive layer 15 is formed on each first inorganic light emitting diode LED1 and the second inorganic light emitting diode LED2 corresponding to a portion of the first pixel electrode PE1 and the second pixel electrode PE2, respectively, and the conductive adhesive layer 15 in the each first inorganic light emitting diode LED1 and the second inorganic light emitting diode LED2 is contact with the corresponding portion of the first pixel electrode PE1 and the second pixel electrode PE2 respectively. Therefore, after the conductive adhesive layer 15 is solidified, each first inorganic light emitting diode LED1 and each second inorganic light emitting diode LED2 can be attached to the first pixel electrode PE1 and the second pixel electrode PE2 respectively and electrically connected to the first pixel electrode PE1 and the second pixel electrode PE2 respectively. Alternatively, the conductive adhesive layer 15 is formed on the first inorganic light emitting diodes LED1 and the second inorganic light emitting diodes LED2 at first, the conductive adhesive layer 15 formed on the first inorganic light emitting diodes LED1 and the second inorganic light emitting diodes LED2 is than melted, and each first inorganic light emitting diode LED1 and each second inorganic light emitting diode LED2 is disposed on and in contact with the first pixel electrode PE1 and the second first pixel electrode PE2. After the conductive adhesive layer 15 is solidified, each first inorganic light emitting diode LED1 and each second inorganic light emitting diode LED2 can be attached to the first pixel electrode PE1 and the second pixel electrode PE2 respectively and electrically connected to the first pixel electrode PE1 and the second pixel electrode PE2 respectively. Moreover, the melting point of the conductive adhesive layer 15 can be approximately less than 350° C., for example approximately lower than 200° C., but approximately higher than 50° C., such that the first inorganic light emitting diodes LED1, the second inorganic light emitting diodes LED2 and other elements will not be damaged during the heating process. The conductive adhesive layer can include a conductive film or other suitable conductive materials, wherein the conductive materials can include at least one of indium (In), bismuth (Bi), tin (Sn), sliver (Ag), gold (Au), copper (Cu), gallium (Ga) and antimony (Sb), but not limited thereto. Furthermore, a carrier substrate (not shown in the drawings) can be optionally disposed between the first electrode 161 and the first inorganic light emitting layer 163, and also disposed between the third electrode 181 and the second inorganic light emitting layer 183. The carrier substrate can include for example a silicon substrate, a silicon carbide (SiC) substrate, a gallium arsenide (GaAs) substrate, a gallium nitride (GaN) substrate or a sapphire substrate, but not limited thereto. The first inorganic light emitting layer 163 and the second inorganic light emitting layer 183 are directly grown on the surface of the carrier substrate. Also, the first inorganic light emitting diodes LED1 and the second inorganic light emitting diodes LED2 in this embodiment are selected from a microminiaturized inorganic light emitting diode (also known as micro LEDs, p-LED), and the size (referring to the length and width) of the microminiaturized inorganic light emitting diode is substantially less than 5 micrometers. In other words, the size of the inorganic light emitting diodes is less than micrometer scale, but not limited thereto.

In addition, the pixel structure 10 of inorganic light emitting diode according to the embodiment can further include a dielectric layer 13, a patterned bank (or namely bank, or wall) 20, a passivation layer 22, a filling layer 24 and a transparent electrode 26. In other embodiments, the pixel structure 10 of inorganic light emitting diode can optionally omit the patterned bank 20 but include other films, such as the dielectric layer 13, the passivation layer 22, the filling layer 24 and the transparent electrode 26. The dielectric layer 13 is disposed on the first transistor unit T1 and the second transistor unit T2 and at least exposes a portion of the first driving element D1 and a portion of the second switch element SW2 of the first transistor unit T1, and at least exposes a portion of the second driving element D2 and a portion of the fourth switch element SW4 of the second transistor unit T2. Therefore, the first pixel electrode PE1 and the second pixel electrode PE2 disposed on the dielectric layer 13 can be electrically connected to the first end t2 of the driving element D1 and the first end t2 of the second driving element D2, and the first reference line RL1 and the second reference line RL2 disposed on the dielectric layer 13 can be electrically connected to the first end t2 of the second switch element SW2 and the first end t2 of the fourth switch element SW4. The dielectric layer 13 can include a single-layered or a multi-layered structure, and a material of the dielectric layer 13 can include an inorganic material, such as silicon oxide, silicon nitride, silicon oxynitride, aluminum oxide, but not limited thereto. The material of the dielectric layer 13 can also include other suitable inorganic materials, organic materials [e.g. photoresist, benzocyclobutene (BCB), polymethylmethacrylate (PMMA), poly(4-vinylphenol) (PVP), polyvinyl alcohol (PVA), polytetrafluroethene (PTFE), polyimide, polyester or other suitable materials] or organic/inorganic hybrid materials. The patterned bank 20 is disposed on the insulation substrate 14, for example on the dielectric layer 13, wherein the patterned bank 20 has at least two first openings 201 and at least two second openings 202, each first opening 201 exposes each first inorganic light emitting diode LED1 and each second opening 202 exposes each second inorganic light emitting diode LED2. In other embodiment, the patterned bank 20 has a first opening 201 and a second opening 202 exposes all first LED1 and all second LED2, respectively. A material of the patterned bank includes an organic material, such as photoresist, benzocyclobutene (BCB), polymethyl methacrylate (PMMA), polyoxymethylene (POM), polybutylene terephthalate (PBT), polycaprolactone (PCL), polyethylene terephthalate (PET), polycarbonate (PC), polyester, polyethylene (PE), polyphenylene ether ketone (PEEK), polylactic acid (PLA), polypropylene (PP), polystyrene (PS) or polyvinylidene chloride (PVDC), but not limited thereto. The patterned bank 20 can include a single-layered or a multi-layered structure, and the material thereof can also include other suitable inorganic materials (for example, being selected from the aforementioned inorganic materials), organic materials (for example, being selected from the aforementioned organic materials) or organic/inorganic hybrid materials. The passivation layer 22 is disposed on the insulation substrate 14 and covers the insulation substrate 14, e.g. covering the patterned bank 20, wherein the passivation layer 22 exposes a portion of the first pixel electrode PE1, a portion of the second pixel electrode PE2, each first inorganic light emitting diode LED1, each second inorganic light emitting diode LED2, a portion of the first reference line RL1 and a portion of the second reference line RL2. The filling layer 24 is filled in the portion of the first pixel electrode PE1 and the portion of the second pixel electrode PE2 exposed by the passivation layer 22. Further, the filling layer 24 can be filled in a space between the first inorganic light emitting diodes LED1 and the passivation layer 22 and filled in a space between the second inorganic light emitting diodes LED2 and the passivation layer 22. The passivation layer 22 can include a single-layered or a multi-layered structure, and a material of the passivation layer 22 includes an inorganic material, such as silicon oxide, silicon nitride, silicon oxynitride and aluminum oxide, but not limited thereto. The material of the passivation layer 22 can also include other suitable inorganic materials, organic materials (for example, being selected from the aforementioned organic materials) or organic/inorganic hybrid materials. In other embodiment, the passivation layer 22 can be optionally omitted, and the filling layer 24 is filled in an exposed portion of the first pixel electrode PE1 and an exposed portion of the second pixel electrode PE2. Moreover, the transparent electrode 26 is disposed on the passivation layer 22, for electrically connected to the second electrode 162 of each first inorganic light emitting diode LED1 and the first power line PL1 and also electrically connected to the fourth electrode 182 of each second inorganic light emitting diode LED2 and the first power line PL1. In this embodiment, the first electrode 161 of each first inorganic light emitting diode LED1 for example is an anode and the second electrode 162 of each first inorganic light emitting diode LED1 for example is a cathode, and the third electrode 181 of each second inorganic light emitting diode LED2 for example is an anode and the fourth electrode 182 of each second inorganic light emitting diode LED2 for example is a cathode, but not limited thereto. Furthermore, the transparent electrode 26 which is adapted to electrically connect the second electrode 162 and the first power line PL1 as well as electrically connect the fourth electrode 182 and the first power line PL1 can be electrically connected to each other or electrically isolated from each other.

In this embodiment, the first power line PL1 is disposed between the two adjacent first sub-pixels 121 and the second sub-pixel 122, and the first sub-pixel 121 and the second sub-pixel 122 share an OVSS signal provided by the same first power line PL1. Also, the first reference line RL1 is disposed adjacent to the third boundary B3 of the first sub-pixel 121 and the first reference line RL1 provides a first reference potential signal to the first sub-pixel 121, and the second reference line RL2 is disposed adjacent to the sixth boundary B6 of the second sub-pixel 122 and the second reference line RL2 provides a second reference potential signal to the second sub-pixel 122. In other words, the second reference line RL2 is not disposed between the first power line PL1 and the first reference line RL1, and/or the first reference line RL1 is not disposed between the first power line PL1 and the second reference line RL2. Optional, no other sub-pixel within LED exists between the first sub-pixels 121 and the second sub-pixel 122. Thus, when the first sub-pixel 121 and the second sub-pixel 122 are arranged in the same row, the aforementioned wires will be arranged by an order of the first reference line RL1, the first power line PL1, the second reference line RL2 and the first power line PL1 in the row direction. With such arrangement, a first gap G1 defined between the first power line PL1 and the first reference line RL1 can be substantially equal to a second gap G2 defined between the first power line PL1 and the second reference line RL2. Accordingly, when the first sub-pixel 121 and the second sub-pixel 122 are arranged in the same column, the aforementioned wires will be arranged by an order of the first reference line RL1, the first power line PL1, the second reference line RL2 and the first power line PL1 in the column direction. Therefore, the first sub-pixel 121 and the second sub-pixel 122 will have substantially the same length, so as to improve the uniformity of light.

In this disclosure, driving units (the first transistor unit or the second transistor unit) used in the pixel structure of inorganic light emitting diode according to the first embodiment include a 3T1C structure, and it is states that each driving unit includes three thin film transistors (including two switch elements and one driving element) and one storage capacitor, but not limited thereto. According to this disclosure, the driving units used in the pixel structure of inorganic light emitting diode can also include other suitable 3T1C structure, 3T2C structure, 4T1C structure, 4T2C structure, 5T1C structure, 5T2C structure, 6T1C structure, 6T2C structure, or other suitable structures. The following description will detail the pixel structure of inorganic light emitting diode according to other embodiments. In order to compare the differences between the embodiments, also to simplify the description easily, the identical components in each of the following embodiments are marked with identical symbols. Please note that, the following description will detail the dissimilarities among each embodiment and the identical features will not be redundantly described herein.

Figure 4:
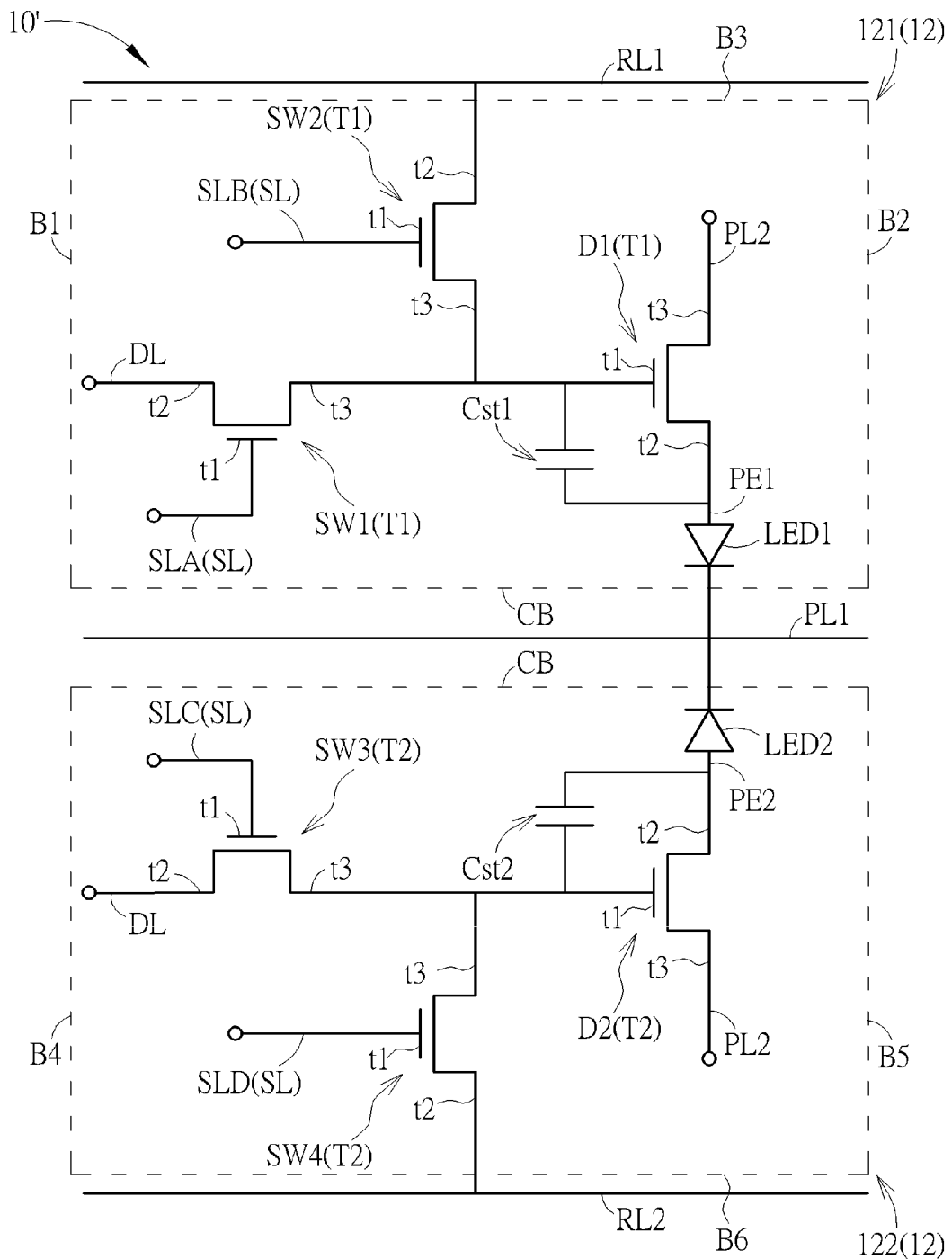
FIG. 4 is an equivalent circuit diagram of the pixel structure of inorganic light emitting diode according to a variant embodiment of the first embodiment.

Referring to FIG. 4, and also referring to FIG. 2 and FIG. 3, FIG. 4 is an equivalent circuit diagram of a pixel structure of inorganic light emitting diode according to a variant embodiment of the first embodiment. As shown in FIG. 4, the pixel structure 10' of inorganic light emitting diode according to this variant embodiment includes another suitable 3T1C structure. In comparison with the first embodiment, this variant embodiment is characterized in that: the second power line PL2 is only electrically connected to the second end t3 of the first driving element D1 and is not connected to the second end t3 of the first switch element SW1 and the second end t3 of the second switch element SW2; and the second power line PL2 is only electrically connected to the second end t3 of the second driving element D2 and is not connected to the second end t3 of the third switch element SW3 and the second end t3 of the fourth switch element SW4. Also, the first storage capacitor Cst1 is connected between the control end t1 and the first end t2 of the first driving element D1, and the second storage capacitor Cst2 is connected between the control end t1 and the first end t2 of the second driving element D2. In another variant embodiment, the first storage capacitor Cst1 can be connected between the control end t1 and the second end t3 of the first driving element D1, and the second storage capacitor Cst2 is connected between the control end t1 and the second end t3 of the second driving element D2.

Figure 5:
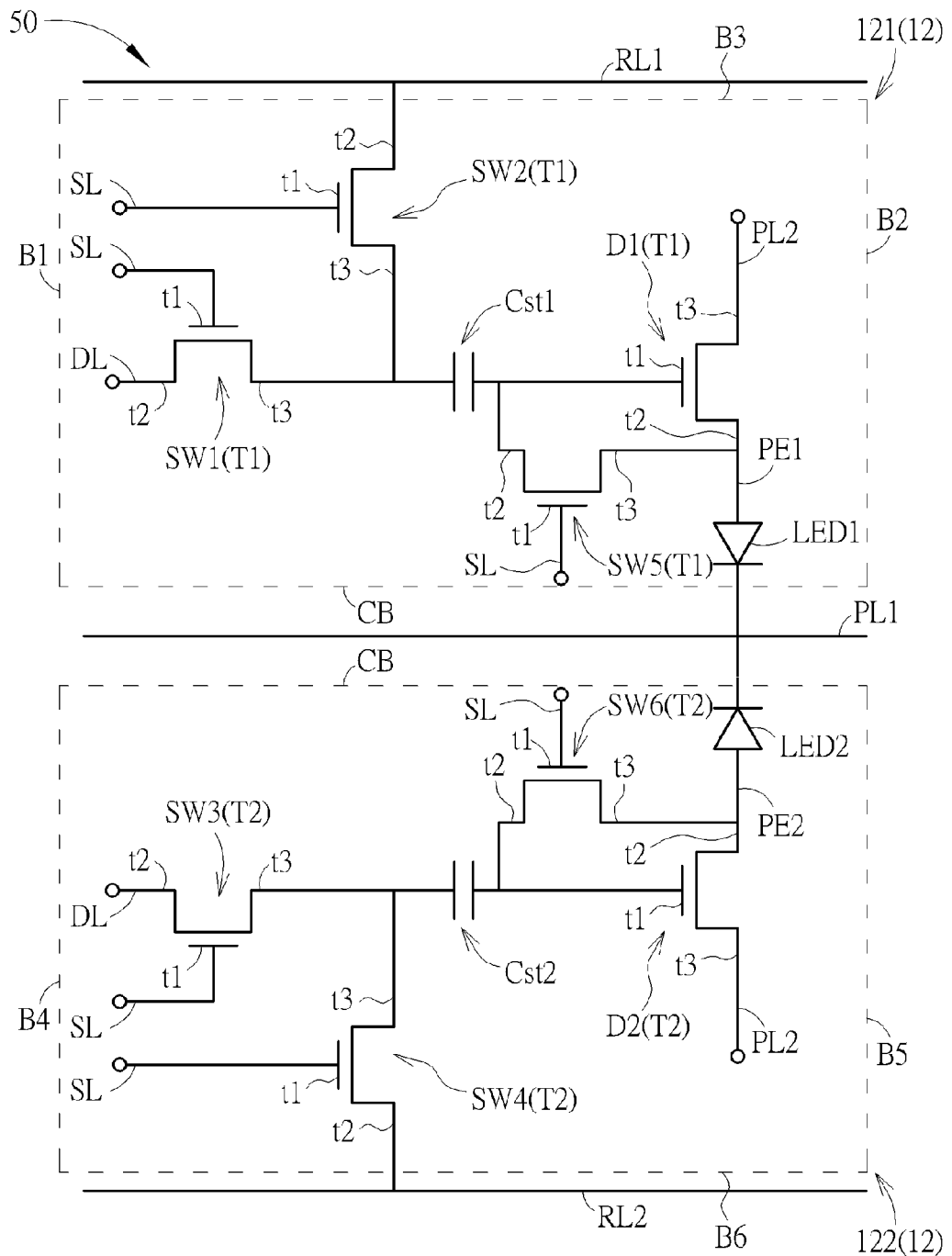
FIG. 5 is an equivalent circuit diagram of a pixel structure of inorganic light emitting diode according to a second embodiment.

Referring to FIG. 5, and also referring to FIG. 2 and FIG. 3, FIG. 5 is an equivalent circuit diagram of the pixel structure of inorganic light emitting diode according to a second embodiment. As shown is FIG. 5, the pixel structure 50 of inorganic light emitting diode according to the second embodiment includes a 4T1C structure, wherein the first transistor unit T1 at least includes a first switch element SW1, a second switch element SW2, a fifth switch element SW5, a first driving element D1 and a first storage capacitor Cst1, and the fifth switch element SW5 is electrically connected to the first inorganic light emitting diodes LED1 and the second switch element SW2. The second transistor unit T2 at least includes a third switch element SW3, a fourth switch element SW4, a sixth switch element SW6, a second driving element D2 and a second storage capacitor Cst2, wherein the sixth switch element SW6 is electrically connected to the second inorganic light emitting diodes LED2 and the fourth switch element SW4. Precisely speaking, the control end t1 of the first switch element SW1 is electrically connected to a scan line SL, the first end t2 of the first switch element SW1 is electrically connected to a data line DL, and the second end t3 of the first switch element SW1 is electrically connected to the control end t1 of the first driving element D1, the second end t3 of the second switch element SW2 and the first end t2 of the fifth switch element SW5. The control end t1 of the second switch element SW2 is electrically connected to the scan line SL, the first end t2 of the second switch element SW2 is electrically connected to a first reference line RL1, and the second end t3 of the second switch element SW2 is electrically connected to the second end t3 of the first switch element SW1, the control end t1 of the first driving element D1 and the first end t2 of the fifth switch element SW5. The control end t1 of the first driving element D1 is electrically connected to the second end t3 of the first switch element SW1, the second end t3 of the second switch element SW2 and the first end t2 of the fifth switch element SW5, the first end t2 of the first driving element D1 is electrically connected to the first pixel electrode PE1, and the second end t3 of the first driving element D1 is electrically connected to the second power line PL2. The control end t1 of the fifth switch element SW5 is electrically connected to the scan line SL, the first end t2 of the fifth switch element SW5 is electrically connected to the second end t3 of the first switch element SW1, the second end t3 of the second switch element SW2 and the control end t1 of the first driving element D1, and the second end t3 of the fifth switch element SW5 is electrically connected to the first end t2 of the first driving element D1 and the first pixel electrode PE1. The first storage capacitor Cst1 is electrically connected to the second end t3 of the first switch element SW1, the second end t3 of the second switch element SW2, and electrically connected between the first end t2 of the fifth switch element SW5 and the control end t1 of the first driving element D1. In this embodiment, the control end t1 of the first switch element SW1, the control end t1 of the second switch element SW2 and the control end t1 of the fifth switch element SW5 can be electrically connected to an identical scan line SL, but not limited thereto. It is stated that at least one of the control end t1 of the first switch element SW1, the control end t1 of the second switch element SW2 and the control end t1 of the fifth switch element SW5 can be electrically connected to another scan line SL with different timing. The control end t1 of the third switch element SW3 is electrically connected to the scan line SL, the first end t2 of the third switch element SW3 is electrically connected to the data line DL, and the second end t3 of the third switch element SW3 is electrically connected to the control end t1 of the second driving element D2, the second end t3 of the fourth switch element SW4 and the first end t2 of the sixth switch element SW6. The control end t1 of the fourth switch element SW4 is electrically connected to the scan line SL, the first end t2 of the fourth switch element SW4 is electrically connected to the second reference line RL2, and the second end t3 of the fourth switch element SW4 is electrically connected to the second end t3 of the third switch element SW3, the control end t1 of the second driving element D2 and the first end t2 of the sixth switch element SW6. The control end t1 of the second driving element D2 is electrically connected to the second end t3 of the second switch element SW2, the second end t3 of the fourth switch element SW4 and the first end t2 of the sixth switch element SW6, the first end t2 of the second driving element D2 is electrically connected to the second pixel electrode PE2, and the second end t3 of the second driving element D2 is electrically connected to the second power line PL2. The control end t1 of the sixth switch element SW6 is electrically connected to the scan line SL, the first end t2 of the sixth switch element SW6 is electrically connected to the second end t3 of the third switch element SW3, the second end t3 of the fourth switch element SW4 and the control end t1 of the second driving element D2, and the second end t3 of the sixth switch element SW6 is electrically connected to the first end t2 of the second driving element D2 and the second pixel electrode PE2. The second storage capacitor Cst2 is electrically connected to the second end t3 of the third switch element SW3, the second end t3 of the fourth switch element SW4, the first end t2 of the sixth switch element SW6 and the control end t1 of the second driving element D2. In this embodiment, the control end t1 of the third switch element SW3, the control end t1 of the fourth switch element SW4 and the control end t1 of the sixth switch element SW6 can be electrically connected to an identical scan line SL, but not limited thereto. It is stated that at least one of the control end t1 of the third switch element SW3, the control end t1 of the fourth switch element SW4 and the control end t1 of the sixth switch element SW6 can be electrically connected to another scan line SL with a different timing.

Figure 6:
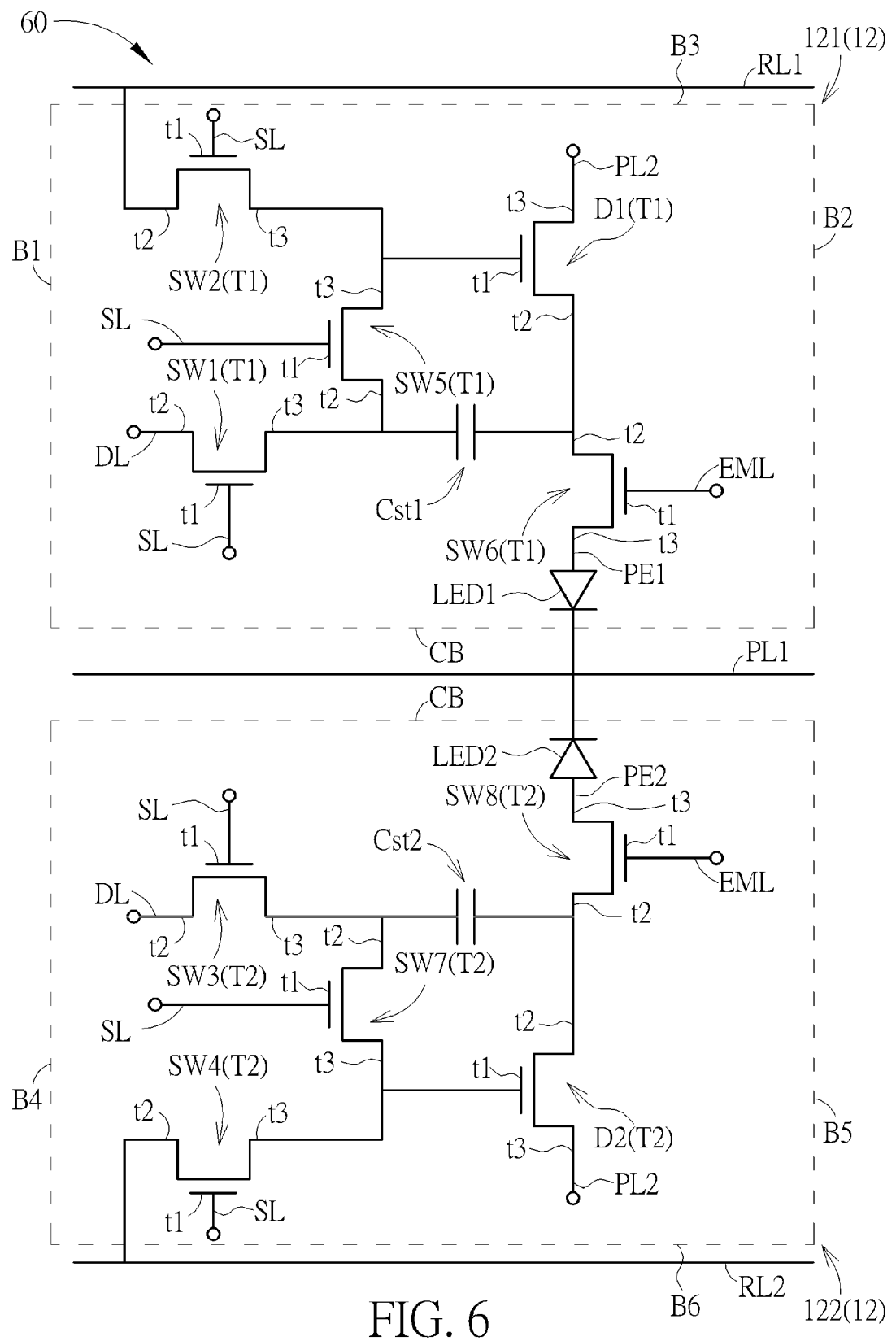
FIG. 6 is an equivalent circuit diagram of a pixel structure of inorganic light emitting diode according to a third embodiment.

Referring to FIG. 6, and also referring to FIG. 2 and FIG. 3, FIG. 6 is an equivalent circuit diagram of the pixel structure of inorganic light emitting diode according to a third embodiment. As shown in FIG. 6, the pixel structure 60 of inorganic light emitting diode according to the third embodiment includes a 5T1C structure, wherein the first transistor unit T1 at least includes a first switch element SW1, a second switch element SW2, a fifth switch element SW5, a sixth switch element SW6, a first driving element D1 and a first storage capacitor Cst1, the fifth switch element SW5 is electrically connected to the second switch element SW2 and the sixth switch element SW6, and the sixth switch element SW6 is electrically connected to the first inorganic light emitting diodes LED1. The second transistor unit T2 at least includes a third switch element SW3, a fourth switch element SW4, a seventh switch element SW7, an eighth switch element SW8, a second driving element D2 and a second storage capacitor Cst2, wherein the seventh switch element SW7 is electrically connected to the fourth switch element SW4 and the eighth switch element SW8, and the eighth switch element SW8 is electrically connected to the second inorganic light emitting diodes LED2. Precisely speaking, the control end t1 of the first switch element SW1 is electrically connected to the scan line SL, the first end t2 of the first switch element SW1 is electrically connected to the data line DL, and the second end t3 of the first switch element SW1 is electrically connected to the first end t2 of the fifth switch element SW5 and the first storage capacitor Cst1. The control end t1 of the second switch element SW2 is electrically connected to the scan line SL, the first end t2 of the second switch element SW2 is electrically connected to the first reference line RL1, and the second end t3 of the second switch element SW2 is electrically connected to the second end t3 of the fifth switch element SW5 and the control end t1 of the first driving element D1. The control end t1 of the fifth switch element SW5 is electrically connected to the scan line SL, the first end t2 of the fifth switch element SW5 is electrically connected to the second end t3 of the first switch element SW1 and the first storage capacitor Cst1, and the second end t3 of the fifth switch element SW5 is electrically connected to the second end t3 of the second switch element SW2 and the control end t1 of the first driving element D1. The control end t1 of the first driving element D1 is electrically connected to the second end t3 of the second switch element SW2 and the second end t3 of the fifth switch element SW5, the first end t2 of the first driving element D1 is electrically connected to the first end t2 of the sixth switch element SW6 and the first storage capacitor Cst1, and the second end t3 of the first driving element D1 is electrically connected to the second power line PL2. The control end t1 of the sixth switch element SW6 is electrically connected to an enabling signal line EML, the first end t2 of the sixth switch element SW6 is electrically connected to the first end t2 of the first driving element D1 and the first storage capacitor Cst1, and the second end t3 of the sixth switch element SW6 is electrically connected to the first pixel electrode PE1. The control end t1 of the third switch element SW3 is electrically connected to the scan line SL, the first end t2 of the third switch element SW3 is electrically connected to the data line DL, and the second end t3 of the third switch element SW3 is electrically connected to the first end t2 of the seventh switch element SW7 and the second storage capacitor Cst2. The control end t1 of the fourth switch element SW4 is electrically connected to the scan line SL, the first end t2 of the fourth switch element SW4 is electrically connected to the second reference line RL2, and the second end t3 of the fourth switch element SW4 is electrically connected to the second end t3 of the seventh switch element SW7 and the control end t1 of the second driving element D2. The control end t1 of the seventh switch element SW7 is electrically connected to the scan line SL, the first end t2 of the seventh switch element SW7 is electrically connected to the second end t3 of the third switch element SW3 and the second storage capacitor Cst2, and the second end t3 of the seventh switch element SW7 is electrically connected to the second end t3 of the fourth switch element SW4 and the control end t1 of the second driving element D2. The control end t1 of the second driving element D2 is electrically connected to the second end t3 of the fourth switch element SW4 and the second end t3 of the seventh switch element SW7, the first end t2 of the second driving element D2 is electrically connected to the first end t2 of the eighth switch element SW8 and the second storage capacitor Cst2, and the second end t3 of the second driving element D2 is electrically connected to the second power line PL2. The control end t1 of the eighth switch element SW8 is electrically connected to the enabling signal line EML, the first end t2 of the eighth switch element SW8 is electrically connected to the first end t2 of the second driving element D2 and the second storage capacitor Cst2, and the second end t3 of the eighth switch element SW8 is electrically connected to the second pixel electrode PE2.

In this embodiment, the control end t1 of the first switch element SW1, the control end t1 of the second switch element SW2 and the control end t1 of the fifth switch element SW5 can be electrically connected to an identical scan line SL, but not limited thereto. It is stated that at least one of the control end t1 of the first switch element SW1, the control end t1 of the second switch element SW2 and the control end t1 of the fifth switch element SW5 can be electrically connected to another scan line SL with a different timing. Furthermore, the enabling signal line EML connected to the control end t1 of the sixth switch element SW6 can provide an enabling signal, and the enabling signal line EML can be optionally electrically connected to the scan line SL connected to the control end t1 of the first switch element SW1, the control end t1 of the second switch element SW2 or the control end t1 of the fifth switch element SW5. In this embodiment, the control end t1 of the third switch element SW3, the control end t1 of the fourth switch element SW4 and the control end t1 of the seventh switch element SW7 can be electrically connected to an identical scan line SL, but not limited thereto. It is stated that at least one of the control end t1 of the third switch element SW3, the control end t1 of the fourth switch element SW4 and the control end t1 of the seventh switch element SW7 can be electrically connected to another scan line SL with a different timing. Also, the enabling signal line EML connected to the control end t1 of the eighth switch element SW8 can provide an enabling signal, and the enabling signal line EML can be optionally electrically connected to the scan line SL connected to the control end t1 of the third switch element SW3, the control end t1 of the fourth switch element SW4 and the control end t1 of the seventh switch element SW7.

Figure 7:
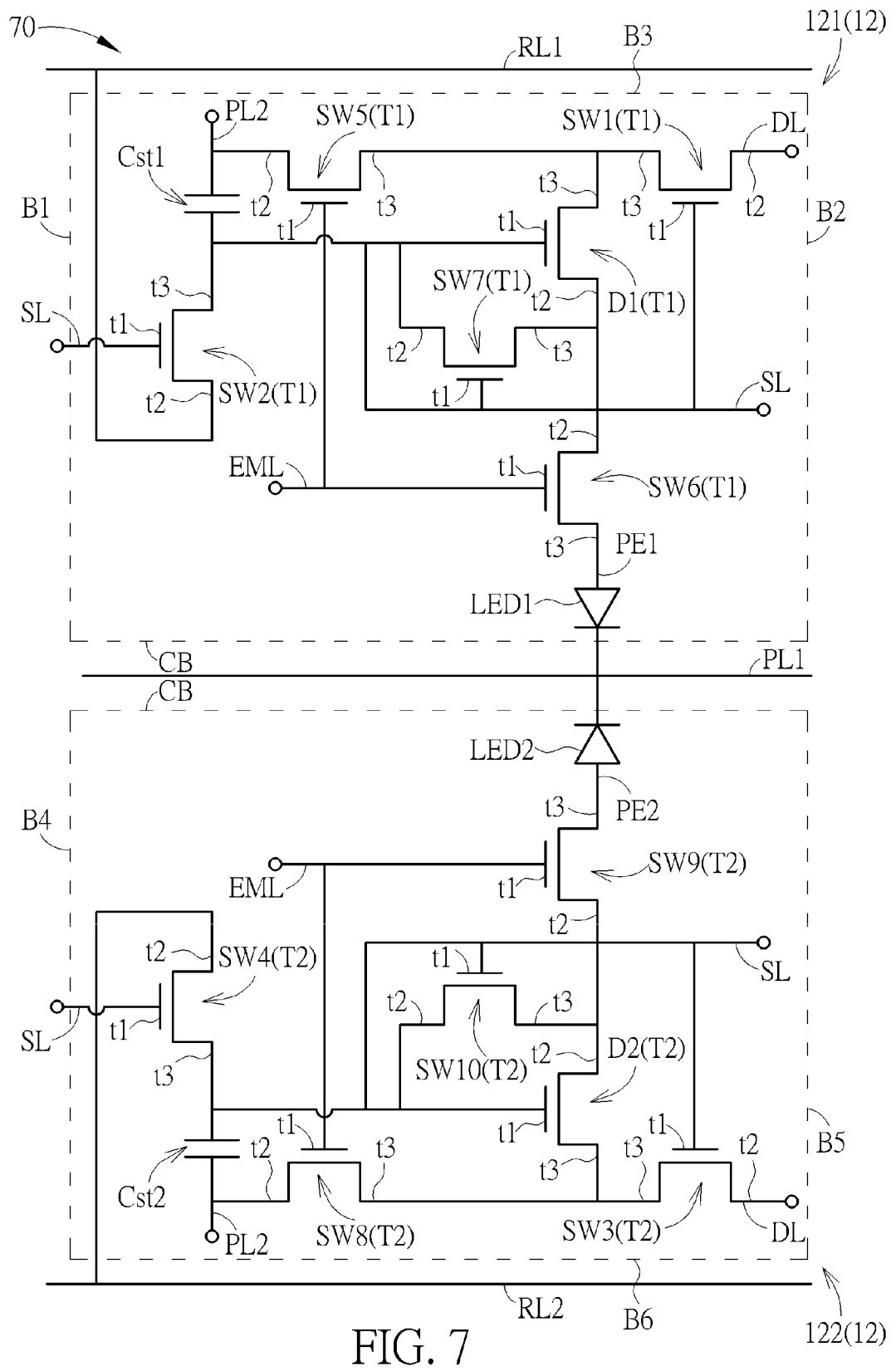
FIG. 7 is an equivalent circuit diagram of a pixel structure of inorganic light emitting diode according to a fourth embodiment.

Referring to FIG. 7, and also referring to FIG. 2 and FIG. 3, FIG. 7 is an equivalent circuit diagram of the pixel structure of inorganic light emitting diode according to a fourth embodiment. As shown in FIG. 7, the pixel structure 70 of inorganic light emitting diode according to the fourth embodiment includes a 6T1C structure, wherein the first transistor unit T1 at least includes a first switch element SW1, a second switch element SW2, a fifth switch element SW5, a sixth switch element SW6, a seventh switch element SW7, a first driving element D1 and a first storage capacitor Cst1. The fifth switch element SW5 is electrically connected to the second power line PL2 and the sixth switch element SW6, the sixth switch element SW6 is electrically connected to the first switch element SW1 and the first driving element D1, and the seventh switch element SW7 is electrically connected to the first driving element D1 and the second switch element SW2. The second transistor unit T2 at least includes a third switch element SW3, a fourth switch element SW4, an eighth switch element SW8, a ninth switch element SW9, a tenth switch element SW10, a second driving element D2 and a second storage capacitor Cst2, wherein the eighth switch element SW8 is electrically connected to the second power line PL2 and the ninth switch element SW9, the ninth switch element SW9 is electrically connected to the third switch element SW3 and the second driving element D2, and the tenth switch element SW10 is electrically connected to the second driving element D2 and the fourth switch element SW4. Precisely speaking, the control end t1 of the first switch element SW1 is electrically connected to the scan line SL, the first end t2 of the first switch element SW1 is electrically connected to the data line DL, and the second end t3 of the first switch element SW1 is electrically connected to the second end t3 of the fifth switch element SW5 and the second end t3 of the first driving element D1. The control end t1 of the second switch element SW2 is electrically connected to the scan line SL, the first end t2 of the second switch element SW2 is electrically connected to the first reference line RL1, and the second end t3 of the second switch element SW2 is electrically connected to the control end t1 of the first driving element D1, the first end t2 of the seventh switch element SW7 and the first storage capacitor Cst1. A control end t1 of the fifth switch element SW5 is electrically connected to the control end t1 of the sixth switch element SW6 and the enabling signal line EML, the first end t2 of the fifth switch element SW5 is electrically connected to the second power line PL2 and the first storage capacitor Cst1, and the second end t3 of the fifth switch element SW5 is electrically connected to the second end t3 of the first switch element SW1 and the second end t3 of the first driving element D1. The control end t1 of the first driving element D1 is electrically connected to the second end t3 of the second switch element SW2, the first storage capacitor Cst1 and the control end t1 and the first end t2 of the seventh switch element SW7, the first end t2 of the first driving element D1 is electrically connected to the first end t2 of the sixth switch element SW6 and the second end t3 of the seventh switch element SW7, and the second end t3 of the first driving element D1 is electrically connected to the second end t3 of the first switch element SW1 and the second end t3 of the fifth switch element SW5. The control end t1 of the seventh switch element SW7 is electrically connected to the scan line SL, the second end t3 of the second switch element SW2, the first storage capacitor Cst1 and the control end t1 of the first driving element D1, the first end t2 of the seventh switch element SW7 is electrically connected to the control end t1 of the first driving element D1, the second end t3 of the second switch element SW2 and the first storage capacitor Cst1, and the second end t3 of the seventh switch element SW7 is electrically connected to the first end t2 of the first driving element D1 and the first end t2 of the sixth switch element SW6. The control end t1 of the sixth switch element SW6 is electrically connected to the control end t1 of the fifth switch element SW5 and the enabling signal line EML, the first end t2 of the sixth switch element SW6 is electrically connected to the first end t2 of the first driving element D1 and the second end t3 of the seventh switch element SW7, and the second end t3 of the sixth switch element SW6 is electrically connected to the first pixel electrode PE1. The control end t1 of the third switch element SW3 is electrically connected to the scan line SL, the first end t2 of the third switch element SW3 is electrically connected to the data line DL, and the second end t3 of the third switch element SW3 is electrically connected to the second end t3 of the eighth switch element SW8 and the second end t3 of the second driving element D2. The control end t1 of the fourth switch element SW4 is electrically connected to the scan line SL, the first end t2 of the fourth switch element SW4 is electrically connected to the second reference line RL2, and the second end t3 of the fourth switch element SW4 is electrically connected to the control end t1 of the second driving element D2, the first end t2 of the tenth switch element SW10 and the second storage capacitor Cst2. The control end t1 of the eighth switch element SW8 is electrically connected to the control end t1 of the ninth switch element SW9 and the enabling signal line EML, the first end t2 of the eighth switch element SW8 is electrically connected to the second power line PL2 and the second storage capacitor Cst2, and the second end t3 of the eighth switch element SW8 is electrically connected to the second end t3 of the third switch element SW3 and the second end t3 of the second driving element D2. The control end t1 of the second driving element D2 is electrically connected to the second end t3 of the fourth switch element SW4, the second storage capacitor Cst2 and the control end t1 and the first end t2 of the tenth switch element SW10, the first end t2 of the second driving element D2 is electrically connected to the first end t2 of the ninth switch element SW9 and the second end t3 of the tenth switch element SW10, and the second end t3 of the second driving element D2 is electrically connected to the second end t3 of the third switch element SW3 and the second end t3 of the eighth switch element SW8. The control end of the tenth switch element SW10 is electrically connected to the scan line SL, the second end t3 of the fourth switch element SW4, the second storage capacitor Cst2 and the control end t1 of the second driving element D2, the first end t2 of the tenth switch element SW10 is electrically connected to the control end t1 of the second driving element D2, and the second end t3 of the tenth switch element SW10 is electrically connected to the first end t2 of the second driving element D2 and the first end t2 of the ninth switch element SW9. The control end t1 of the ninth switch element SW9 is electrically connected to the control end t1 of the eighth switch element SW8 and the enabling signal line EML, the first end t2 of the ninth switch element SW9 is electrically connected to the first end t2 of the second driving element D2 and the second end t3 of the tenth switch element SW10, and the second end t3 of the ninth switch element SW9 is electrically connected to the second pixel electrode PE2.

In this embodiment, the control end t1 of the first switch element SW1 and the control end t1 of the second switch element SW2 can be electrically connected to an identical scan line SL, but not limited thereto. It is stated that the control end t1 of the first switch element SW1 and the control end t1 of the second switch element SW2 can be electrically connected to different scan lines SL. Furthermore, the enabling signal line EML connected to the control end t1 of the fifth switch element SW5 and the control end t1 of the sixth switch element SW6 can provide an enabling signal, and the enabling signal line EML can be optionally electrically connected to the scan line SL connected to the control end t1 of the first switch element SW1 or the control end t1 of the second switch element SW2. The control end t1 of the third switch element SW3 and the control end t1 of the fourth switch element SW4 can be electrically connected to an identical scan line SL, but not limited thereto. It is stated that the control end t1 of the third switch element SW3 and the control end t1 of the fourth switch element SW4 can be electrically connected to different scan lines SL. Also, the enabling signal line EML connected to the control end t1 of the eighth switch element SW8 and the control end t1 of the ninth switch element SW9 can provide an enabling signal, and the enabling signal line EML can be optionally electrically connected to the scan line SL connected to the control end t1 of the third switch element SW3 or the control end t1 of the fourth switch element SW4.

Please noted that, in this disclosure, the practical installation of the first reference line RL1, the first power line PL1 and the second reference line RL2 is arranged according to what is illustrated in the drawings of this disclosure, and the locations of the second power line PL2, the scan line SL, the data line DL and other elements are not limited to what is illustrated in in the drawings of this disclosure. Also, the signals, as well as the potential relations, of the first reference line RL1, the first power line PL1 and the second reference line RL2 can also refer to what is illustrated in FIG. 1.

Furthermore, the driving elements in this embodiment are to have the same polarity type to the switch elements, such as N-type thin film transistor, for example, but not limited thereto. In other embodiments, the polarity type of the driving elements and the switch elements are P-type thin film transistor; or at least one of the driving elements and the switch elements have different polarity types, e.g. the driving elements are N-type thin film transistors and at least one of the switch elements is P-type thin film transistor, the driving elements are P-type thin film transistors and at least one of the switch elements is N-type thin film transistor, the driving elements are N-type thin film transistors and all switch elements are P-type thin film transistor, or the driving elements are P-type thin film transistors and all switch elements are N-type thin film transistor. Also, at least one of the thin film transistors can include a bottom gate structure, atop gate structure, or other suitable thin film transistor structures, the semiconductor layer of the thin film transistor structures can include a single-layered or a multi-layered structure, and a material of the thin film transistors can include amorphous silicon (a-Si), polycrystalline silicon (poly-Si), microcrystalline silicon (mc-Si), nanocrystalline silicon (nc-Si), organic semiconductor material, oxide semiconductor material, graphene or other suitable materials.

In summary, according to the practical installation of the pixel structure of inorganic light emitting diode in this disclosure, the first power line is disposed between the first sub-pixel and the second sub-pixel adjacent to the first sub-pixel, and the first sub-pixel and the second sub-pixel are electrically connected to the same first power line. Furthermore, the first reference line is disposed adjacent to the third boundary of the first sub-pixel and the first reference line provides the first reference potential signal to the first sub-pixel, and the second reference line is disposed adjacent to the sixth boundary of the second sub-pixel and the second reference line provides the second reference potential signal to the second sub-pixel. In other words, the second reference line is not disposed between the first power line and the first reference line, and/or the first reference line is not disposed between the first power line and the second reference line. With such arrangement, the first gap defined between the first power line and the first reference line can be substantially equal to the second gap defined between the first power line and the second reference line. Namely, the first sub-pixel and the second sub-pixel in the column direction have substantially the same length, so as to improve the uniformity of light.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A pixel structure of light emitting diode, comprising:
a plurality of reference lines disposed on an insulation substrate;
a plurality of first power lines disposed on the insulation substrate;
a plurality of sub-pixels disposed on the insulation substrate;
a plurality of transistor units respectively disposed in the sub-pixels, wherein each of the transistor units at least comprises a first switch element, a second switch element and a first driving element, and each of the reference lines is electrically connected to a first end of the second switch element of the corresponding sub-pixel;
at least one data line disposed on the insulation substrate and electrically connected to a first end of the first switch element;
at least one scan line disposed on the insulation substrate and electrically connected to a control end of the first switch element;
a plurality of pixel electrodes, respectively disposed in the sub-pixels, wherein each of the pixel electrodes is electrically connected to a first end of the first driving element;
a plurality of light emitting diodes disposed on the pixel electrodes of the sub-pixels respectively, wherein each of the light emitting diodes at least comprises a first electrode, a second electrode and an emitting layer interposed between the first electrode and the second electrode, and each of the first power lines is electrically connected to the second electrodes of the light emitting diodes of the sub-pixels disposed adjacent to both sides of the first power line; and
at least one second power line disposed on the insulation substrate and electrically connected to a second end of the first driving element,
wherein the plurality of reference lines, the plurality of first power lines and the plurality of sub-pixels are arranged sequentially and repeatedly in a first direction in an order of the reference line, the sub-pixel, the first power line, the sub-pixel, the reference line, the sub-pixel, the first power line, the sub-pixel and the reference line.

2. The pixel structure of light emitting diode according to claim 1, wherein a first gap is formed between the first power line and the reference line adjacent to one side of the first power line projected on the insulation substrate in a vertical projection direction, a second gap is formed between the first power line and the reference line adjacent to the other side of the first power line projected on the insulation substrate in the vertical projection direction, and the first gap is substantially equal to the second gap.

3. The pixel structure of light emitting diode according to claim 1, further comprising a conductive adhesive layer, interposed between the pixel electrode and the first electrode of each of the light emitting diodes.

4. The pixel structure of light emitting diode according to claim 1, further comprising a patterned bank, disposed on the insulation substrate, wherein the patterned bank has a plurality of openings, and each of the openings exposes at least one of the light emitting diodes.

5. The pixel structure of light emitting diode according to claim 1, further comprising a passivation layer, disposed on the insulation substrate and covering the insulation substrate, wherein the passivation layer exposes a portion of each of the pixel electrodes, each of the light emitting diodes, and a portion of each of the reference lines.

6. The pixel structure of light emitting diode according to claim 5, further comprising a filling layer, filled in the portion of each of the pixel electrodes exposed by the passivation layer.

7. The pixel structure of light emitting diode according to claim 5, further comprising a plurality of transparent electrodes, disposed on the passivation layer wherein each of the transparent electrodes is electrically connected to the second electrode of one of the light emitting diodes and one of the first power lines.

8. The pixel structure of light emitting diode according to claim 1, wherein an electric potential of the first power line is different from an electric potential of the second power line.

9. The pixel structure of light emitting diode according to claim 1, wherein each of the transistor units further comprises a fifth switch element electrically connected to the light emitting diodes and the second switch element.

10. The pixel structure of light emitting diode according to claim 1, wherein each of the transistor units further comprises a fifth switch element and a sixth switch element, the fifth switch element is electrically connected to the second switch element and the sixth switch element, and the sixth switch element is electrically connected to the light emitting diodes.

11. The pixel structure of light emitting diode according to claim 1, wherein each of the transistor units further comprises a fifth switch element, a sixth switch element and a seventh switch element, the fifth switch element is electrically connected to the second power line and the sixth switch element, the sixth switch element is electrically connected to the first switch element and the first driving element and the seventh switch element is electrically connected to the first driving element and the second switch element.

12. A pixel structure of light emitting diode, comprising:
a plurality of reference lines disposed on an insulation substrate;
a plurality of first power lines disposed on the insulation substrate, wherein the reference lines and the first power lines are arranged alternately in a first direction;
a plurality of sub-pixels disposed on the insulation substrate and arranged in the first direction, wherein each of the sub-pixels is disposed between the corresponding reference line and the neighboring first power line;
a plurality of transistor units respectively disposed in the sub-pixels, wherein each of the transistor units at least comprises a first switch element, a second switch element and a first driving element, and each of the reference lines is electrically connected to first ends of the second switch elements of the sub-pixels adjacent to two opposite sides of the reference line;
at least one data line disposed on the insulation substrate and electrically connected to a first end of the first switch element;
at least one scan line disposed on the insulation substrate and electrically connected to a control end of the first switch element;

a plurality of pixel electrodes, respectively disposed in the sub-pixels, wherein each of the pixel electrodes is electrically connected to a first end of the first driving element;
a plurality of light emitting diodes disposed on the pixel electrodes of the sub-pixels respectively, wherein each of the light emitting diodes at least comprises a first electrode, a second electrode and an emitting layer interposed between the first electrode and the second electrode, and each of the first power lines is electrically connected to the second electrodes of the light emitting diodes of the sub-pixels disposed adjacent to two opposite sides of the first power line; and
at least one second power line disposed on the insulation substrate and electrically connected to a second end of the first driving element.

13. The pixel structure of light emitting diode according to claim 12, wherein a first gap is formed between the first power line and the reference line adjacent to one side of the first power line projected on the insulation substrate in a vertical projection direction, a second gap is formed between the first power line and the reference line adjacent to the other side of the first power line projected on the insulation substrate in the vertical projection direction, and the first gap is substantially equal to the second gap.

14. The pixel structure of light emitting diode according to claim 12, further comprising a conductive adhesive layer, interposed between the pixel electrode and the first electrode of each of the light emitting diodes.

15. The pixel structure of light emitting diode according to claim 12, further comprising a patterned bank, disposed on the insulation substrate, wherein the patterned bank has a plurality of openings, and each of the openings exposes at least one of the light emitting diodes.

16. The pixel structure of light emitting diode according to claim 12, further comprising a passivation layer, disposed on the insulation substrate and covering the insulation substrate, wherein the passivation layer exposes a portion of each of the pixel electrodes, each of the light emitting diodes, and a portion of each of the reference lines.

17. The pixel structure of light emitting diode according to claim 16, further comprising a filling layer, filled in the portion of each of the pixel electrodes exposed by the passivation layer.

18. The pixel structure of light emitting diode according to claim 16, further comprising a plurality of transparent electrodes disposed on the passivation layer, wherein each of the transparent electrodes is electrically connected to the second electrode of one of the light emitting diodes and one of the first power lines.

19. The pixel structure of light emitting diode according to claim 12, wherein an electric potential of the first power line is different from an electric potential of the second power line.

20. A pixel structure of light emitting diode, comprising:
a plurality of reference lines disposed on an insulation substrate;
a plurality of first power lines disposed on the insulation substrate;
a plurality of sub-pixels disposed on the insulation substrate and arranged in the first direction, wherein the plurality of reference lines, the plurality of first power lines and the plurality of sub-pixels are arranged sequentially and repeatedly in a first direction in an order of the reference line, the sub-pixel, the first power line, the sub-pixel, the reference line, the sub-pixel, the first power line, the sub-pixel and the reference line, and each of the sub-pixels is disposed between the corresponding reference line and the neighboring first power line;
a plurality of transistor units respectively disposed in the sub-pixels, wherein each of the transistor units at least comprises a first switch element, a second switch element and a first driving element, and each of the reference lines is electrically connected to first ends of the second switch elements of the sub-pixels adjacent to two opposite sides of the reference line;
at least one data line disposed on the insulation substrate and electrically connected to a first end of the first switch element;
at least one scan line disposed on the insulation substrate and electrically connected to a control end of the first switch element;
a plurality of pixel electrodes, respectively disposed in the sub-pixels, wherein each of the pixel electrodes is electrically connected to a first end of the first driving element;
a plurality of light emitting diodes disposed on the pixel electrodes of the sub-pixels respectively, wherein each of the light emitting diodes at least comprises a first electrode, a second electrode and an emitting layer interposed between the first electrode and the second electrode, and each of the first power lines is electrically connected to the second electrodes of the light emitting diodes of the sub-pixels disposed adjacent to two opposite sides of the first power line; and
at least one second power line disposed on the insulation substrate and electrically connected to a second end of the first driving element.

21. The pixel structure of light emitting diode according to claim 20, wherein a first gap is formed between the first power line and the reference line adjacent to one side of the first power line projected on the insulation substrate in a vertical projection direction, a second gap is formed between the first power line and the reference line adjacent to the other side of the first power line projected on the insulation substrate in the vertical projection direction, and the first gap is substantially equal to the second gap.

22. The pixel structure of light emitting diode according to claim 20, further comprising a conductive adhesive layer, interposed between the pixel electrode and the first electrode of each of the light emitting diodes.

23. The pixel structure of light emitting diode according to claim 20, further comprising a patterned bank, disposed on the insulation substrate, wherein the patterned bank has a plurality of openings, and each of the openings exposes at least one of the light emitting diodes.

24. The pixel structure of light emitting diode according to claim 20, further comprising a passivation layer, disposed on the insulation substrate and covering the insulation substrate, wherein the passivation layer exposes a portion of each of the pixel electrodes, each of the light emitting diodes, and a portion of each of the reference lines.

25. The pixel structure of light emitting diode according to claim 24, further comprising a filling layer, filled in the portion of each of the pixel electrodes exposed by the passivation layer.

26. The pixel structure of light emitting diode according to claim 24, further comprising a plurality of transparent electrodes disposed on the passivation layer, wherein each of the transparent electrodes is electrically connected to the second electrode of one of the light emitting diodes and one of the first power lines.

27. The pixel structure of light emitting diode according to claim 20, wherein an electric potential of the first power line is different from an electric potential of the second power line.

28. A pixel structure of light emitting diode, comprising:
a first sub-pixel, a second sub-pixel, a third sub-pixel and a fourth sub-pixel disposed on an insulation substrate;
a first reference line, a second reference line and a third reference line disposed on the insulation substrate;
a $1^{st}$ first power line and a $2^{nd}$ first power line disposed on the insulation substrate, wherein the first reference line, the first sub-pixel, the $1^{st}$ first power line, the second sub-pixel, the second reference line, the third sub-pixel, the $2^{nd}$ first power line, the fourth sub-pixel and the third reference line are arranged in order in a first direction, and wherein a first gap is formed between the first reference line and the $1^{st}$ first power line projected on the insulation substrate in a vertical projection direction, a second gap is formed between the $1^{st}$ first power line and the second reference line projected on the insulation substrate in the vertical projection direction, a third gap is formed between the second reference line and the $2^{nd}$ first power line projected on the insulation substrate in the vertical projection direction, a fourth gap is formed between the $2^{nd}$ first power line and the third reference line projected on the insulation substrate in the vertical projection direction, and the first gap, the second gap, the third gap and the fourth gap are substantially equal to one another;
a plurality of transistor units respectively disposed in the first sub-pixel, the second sub-pixel, the third sub-pixel and the fourth sub-pixel, wherein each of the transistor units at least comprises a first switch element, a second switch element and a first driving element, the first reference line is electrically connected to a first end of the second switch element of the first sub-pixel, the second reference line is electrically connected to a first end of the second switch element of the second sub-pixel and electrically connected to a first end of the second switch element of the third sub-pixel, and the third reference line is electrically connected to a first end of the second switch element of the fourth sub-pixel;
at least one data line disposed on the insulation substrate and electrically connected to first ends of the first switch elements of the first sub-pixel, the second sub-pixel, the third sub-pixel and the fourth sub-pixel;
at least one scan line disposed on the insulation substrate and electrically connected to control ends of the first switch elements of the first sub-pixel, the second sub-pixel, the third sub-pixel and the fourth sub-pixel;
a plurality of pixel electrodes respectively disposed in the first sub-pixel, the second sub-pixel, the third sub-pixel and the fourth sub-pixel, wherein the pixel electrodes are electrically connected to first ends of the first driving elements of the first sub-pixel, the second sub-pixel, the third sub-pixel and the fourth sub-pixel;
a plurality of light emitting diodes disposed on the pixel electrodes of the sub-pixels respectively, wherein each of the light emitting diodes at least comprises a first electrode, a second electrode and an emitting layer interposed between the first electrode and the second electrode, the $1^{st}$ first power lines is electrically connected to the second electrodes of the light emitting diodes of the first sub-pixel and the second sub-pixel, and the $2^{nd}$ first power lines is electrically connected to the second electrodes of the light emitting diodes of the third sub-pixel and the fourth sub-pixel; and at least one second power line disposed on the insulation substrate and electrically connected to second ends of the first driving elements of the first sub-pixel, the second sub-pixel, the third sub-pixel and the fourth sub-pixel, wherein the reference lines, the sub-pixels and the first power lines are arranged sequentially and repeatedly in an order of the first reference line, the first sub-pixel, the $1^{st}$ first power line, the second sub-pixel, the second reference line, the third sub-pixel, the $2^{nd}$ first power line, the fourth sub-pixel and the third reference line.

29. The pixel structure of light emitting diode according to claim 28, further comprising a conductive adhesive layer, interposed between the pixel electrode and the first electrode of each of the light emitting diodes.

30. The pixel structure of light emitting diode according to claim 28, further comprising a patterned bank, disposed on the insulation substrate, wherein the patterned bank has a plurality of openings, and each of the openings exposes at least one of the light emitting diodes.

31. The pixel structure of light emitting diode according to claim 28, further comprising a passivation layer, disposed on the insulation substrate and covering the insulation substrate, wherein the passivation layer exposes a portion of each of the pixel electrodes, each of the light emitting diodes, and a portion of each of the reference lines.

32. The pixel structure of light emitting diode according to claim 31, further comprising a filling layer, filled in the portion of each of the pixel electrodes exposed by the passivation layer.

33. The pixel structure of light emitting diode according to claim 31, further comprising a plurality of transparent electrodes disposed on the passivation layer, wherein each of the transparent electrodes is electrically connected to the second electrode of one of the light emitting diodes and the $1^{st}$ first power line or the $2^{nd}$ first power line.

34. The pixel structure of light emitting diode according to claim 28, wherein an electric potential of the $1^{st}$ first power line or the $2^{nd}$ first power line is different from an electric potential of the second power line.

* * * * *